(12) United States Patent
Ritter et al.

(10) Patent No.: US 9,348,003 B2
(45) Date of Patent: May 24, 2016

(54) MEASURING SYSTEM

(71) Applicant: Micronas GmbH, Freiburg (DE)

(72) Inventors: Joachim Ritter, Loerrach (DE); Joerg Franke, Freiburg (DE)

(73) Assignee: Micronas GmbH, Freiburg (DE)

( * ) Notice: Subject to any disclaimer, the term of this patent is extended or adjusted under 35 U.S.C. 154(b) by 86 days.

(21) Appl. No.: 14/154,812

(22) Filed: Jan. 14, 2014

(65) Prior Publication Data

US 2014/0197821 A1 Jul. 17, 2014

(30) Foreign Application Priority Data

Jan. 14, 2013 (DE) .................. 10 2013 000 432

(51) Int. Cl.
 *G01B 7/30* (2006.01)
 *G01R 33/09* (2006.01)
 *G01D 5/14* (2006.01)

(52) U.S. Cl.
 CPC ............... *G01R 33/09* (2013.01); *G01D 5/145* (2013.01)

(58) Field of Classification Search
 CPC .... G01R 33/0206; G01R 33/09; G01R 33/07; G01R 15/202; G01R 33/00; G01R 33/02; G01B 7/30
 USPC ............... 324/207.2, 207.11, 207.23, 207.25, 324/174, 244, 251, 173, 207.21
 See application file for complete search history.

(56) References Cited

U.S. PATENT DOCUMENTS

| | | | |
|---|---|---|---|
| 4,785,242 A | 11/1988 | Vaidya et al. | |
| 5,558,091 A * | 9/1996 | Acker et al. | 600/424 |
| 6,894,487 B2 | 5/2005 | Kunz-Vizenetz | |
| 6,965,227 B2 | 11/2005 | Blossfeld | |
| 7,096,593 B2 | 8/2006 | Schmied | |
| 7,307,414 B2 | 12/2007 | Ito | |
| 7,420,363 B2 | 9/2008 | Hatanaka et al. | |
| 2007/0194781 A1* | 8/2007 | Zhitomirskiy | 324/207.17 |
| 2008/0044119 A1 | 2/2008 | Aoki et al. | |
| 2010/0097059 A1 | 4/2010 | Estrada et al. | |
| 2011/0187351 A1* | 8/2011 | Hunger | 324/207.2 |
| 2011/0291650 A1 | 12/2011 | Franke et al. | |
| 2012/0095712 A1 | 4/2012 | Komasaki et al. | |

(Continued)

FOREIGN PATENT DOCUMENTS

| DE | 103 34 869 B3 | 9/2004 |
|---|---|---|
| DE | 103 49 556 A1 | 6/2005 |

(Continued)

OTHER PUBLICATIONS

Joachim Quasdorf, "Auflösung von Winkelmessungemerhöhen," Elektronik Praxis, vol. 18, pp. 22-26 (Sep. 17, 2008).

*Primary Examiner* — Tung X Nguyen
*Assistant Examiner* — Neel Shah
(74) *Attorney, Agent, or Firm* — Muncy, Geissler, Olds & Lowe, P.C.

(57) ABSTRACT

A measuring system having a first magnetic field sensor, a second magnetic field sensor, a third magnetic field sensor, an encoder, and an evaluation circuit to which the first magnetic field sensor, the second magnetic field sensor, and the third magnetic field sensor are connected. The evaluation circuit is configured to determine the position of the encoder based on a first measurement signal of the first magnetic field sensor and a second measurement signal of the second magnetic field sensor and a third measurement signal of the third magnetic field sensor.

13 Claims, 3 Drawing Sheets

(56) References Cited

U.S. PATENT DOCUMENTS

| | | | |
|---|---|---|---|
| 2012/0194175 A1* | 8/2012 | Ausserlechner | 324/207.14 |
| 2012/0262157 A1 | 10/2012 | Liebart | |
| 2013/0027028 A1 | 1/2013 | Hohe et al. | |
| 2013/0218517 A1* | 8/2013 | Ausserlechner | 702/151 |
| 2013/0221956 A1 | 8/2013 | Kotani et al. | |

FOREIGN PATENT DOCUMENTS

| | | |
|---|---|---|
| DE | 10 2004 010 948 A1 | 10/2005 |
| DE | 10 2005 049 312 A1 | 4/2007 |
| DE | 10 2007 009 585 A1 | 9/2007 |
| DE | 10 2007 022 196 A1 | 11/2007 |
| DE | 10 2008 059 401 A | 6/2010 |
| DE | 10 2010 003 292 A1 | 9/2011 |
| DE | 10 2010 019 508 A1 | 11/2011 |
| EP | 1 111 392 A1 | 6/2001 |
| EP | 1 477 772 A1 | 11/2004 |
| EP | 1 503 182 B1 | 12/2008 |
| EP | 2 339 299 A2 | 6/2011 |
| EP | 2 354 769 A1 | 8/2011 |
| JP | 2003/194901 A | 7/2003 |
| WO | WO 2012/060216 A1 | 5/2012 |
| WO | WO 2013/050535 A2 | 4/2013 |

* cited by examiner

MEASURING SYSTEM

This nonprovisional application claims priority under 35 U.S.C. §119(a) to German Patent Application No. DE 10 2013 000 432.2, which was filed in Germany on Jan. 14, 2013, and which is herein incorporated by reference.

BACKGROUND OF THE INVENTION

1. Field of the Invention

The present invention relates to a measuring system.

2. Description of the Background Art

EP 2 354 769 A1, which corresponds to US 20110187351, which is incorporated herein by reference, discloses an angle sensor and a method for determining an angle between a sensor system and a magnetic field. The angle sensor has a magnetic field-generating magnet, which is adjustable with regard to a rotation axis in different rotational positions relative to the sensor system. The sensor system has a first magnetic field sensor for detecting a first magnetic field component, oriented transversely to the rotation axis, and a second magnetic field sensor for detecting a second magnetic field component, situated transversely to plane extending from the rotation axis and the first magnetic field component. The sensor system has a third magnetic field sensor for detecting a third magnetic field component oriented in the direction of the rotation axis.

DE 10 2008 059 401 A1, which corresponds to US 20110291650, discloses a semiconductor chip and a method for generating pulse edges, assigned synchronously to the movement of a mechanical part. A magnetic field is generated and at least two measurement signals for the magnetic field are detected. The magnetic field is changed as a function of the movement of the mechanical part in such a way that the measurement signals are modulated phase-shifted to one another. A first measurement signal is compared with a first reference value. A second measurement signal is compared with a second reference value. The value of the first measurement signal is compared with the value of the second measurement signal. A pulse edge is generated when at least one of these comparisons produces an agreement or the result of the relevant comparison changes its sign.

EP 1 111 392 A1, which corresponds to U.S. Pat. No. 6,965,227, which is incorporated herein by reference, discloses a detection of the rotational speed and angular position of a rotating wheel with an adjustable switching threshold for drift compensation. The detection of the rotational speed and angular position of a wheel occurs by means of a non-contact sensor which scans the wheel and generates a pulse train. The amplitude of the pulse is compared in a comparator with a variable switching threshold. The switching threshold is adjusted so that the value of the difference between the pulse amplitude and the switching threshold does not exceed a predefinable maximum value.

An optical nonius system is known from ELEKTRONIK PRAXIS, No. 18, 17 Sep. 2008, page 22, by J. Quasdorf. The interpolation of analog sine signals is an evaluation function in the case of position sensors. It is possible with a special method to evaluate a number of measurement scales and to combine them to form a position value. Measuring systems are possible thereby that offer a high integral accuracy or very high resolutions with good differential precision. A small optical sensor is sufficient for the scanning.

An angle rotation sensor is known from EP 1 503 182 B1, which corresponds to U.S. Pat. No. 6,894,487. The rotation angle sensor has a rotary shaft, a magnet coupled to the rotary shaft, and a magnet-sensitive sensor element. The sensor element generates a sinusoidal and a cosinusoidal output signal as a function of the relative rotation angle between the magnet and the sensor. The rotation angle sensor has an evaluation unit, which generates a signal corresponding to the rotation angle from the output signals. In addition, the shaft is movably guided linearly parallel to its axis along a guide track during its rotation around its axis, so that the distance between the magnet and sensor changes according to a pitch of the guide track. The evaluation unit determines from the output signals of the sensor element a signal from which the distance between the sensor element and the magnet and thereby the number of full rotations of the shaft can be determined. A fine signal within a full rotation is determined from the sinusoidal and cosinusoidal output signals and this fine signal is added to the value of the full rotation multiplied by 360°.

SUMMARY OF THE INVENTION

Against this background, it is an object of the present invention to provide a circuit that refines the state of the art.

Accordingly, a measuring system is provided with a magnetic field sensor array and with an encoder and with an evaluation circuit.

The magnetic field sensor array has a first magnetic field sensor, integrated into a semiconductor chip, for measuring a first component of a magnetic field vector in a first spatial direction and a second magnetic field sensor, integrated into a semiconductor chip, for measuring a second component of the magnetic field vector in a second spatial direction, and a third magnetic field sensor, integrated into a semiconductor chip, for measuring a third component of the magnetic field vector in a third spatial direction.

The encoder is designed to change the magnetic field vector in the first spatial direction and in the second spatial direction and in the third spatial direction, as a function of its rotatory and/or translational movement. The magnetic field vector is defined here at the place of the magnetic field sensors by the measurement of the magnetic field vector components. The change, caused by the movement of the encoder, in the magnetic field vector describes a closed and non-intersecting line in all three spatial directions.

The first magnetic field sensor and the second magnetic field sensor and the third magnetic field sensor are connected to the evaluation circuit. The evaluation circuit is set up to determine the position of the encoder based on a first measurement signal of the first magnetic field sensor and a second measurement signal of the second magnetic field sensor and a third measurement signal of the third magnetic field sensor.

Tests by the applicant show that a number of advantages are achieved by the substance of the invention, therefore by the course of the sensed magnetic field vector as a closed and non-intersecting line in all three spatial directions. Thus, a position of the encoder is to be assigned unambiguously to each magnetic field vector. In addition, a high resolution can be achieved by a plurality of pole reversals. In addition, the movement of the encoder is not limited to an exclusively rotatory or to an exclusively transversal movement, but more complex courses of movement can also be detected.

According to an embodiment, the line described by the magnetic field vector is helical at least in sections.

In a further embodiment, the encoder is designed to modulate a length of the magnetic field vector, as a function of the rotatory and/or translational movement. Such an amplitude modulation can occur in different spatial directions for one or more components of the magnetic field vector.

Preferably, the line described by the magnetic field vector has at least two helical sections lying one inside the other.

Preferably, the helical sections lying one inside the other are spaced apart from one another by different amplitudes of the magnetic field vector in at least two spatial directions.

According to a further embodiment, the encoder is designed to modulate a pitch of a helical shape of the line of the magnetic field vector, as a function of the rotary and/or translational movement of the encoder.

According to a further embodiment, the encoder is designed to modulate, as a function of the rotary and/or translational movement, a first oscillation of the first component of the magnetic field vector with a first frequency and a second oscillation of the second component of the magnetic field vector with a second frequency, whereby the first frequency and the second frequency are different.

In an embodiment, the encoder has a number of magnets and/or a number of coils to generate the magnetic field vector.

In a further embodiment, the magnetic field sensor array has a number of magnets and/or a number of coils to generate the magnetic field vector. Advantageously, the magnetic field vector is changed by the magnetic conductive material of the encoder, for example, by the teeth of gear wheels, by the movement of the encoder.

The previously described refinement variants are especially advantageous both individually and in combination. In this regard, all refinement variants can be combined with one another. Some possible combinations are explained in the description of the exemplary embodiments shown in the figures. These possible combinations of the refinement variants, depicted therein, are not definitive, however.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
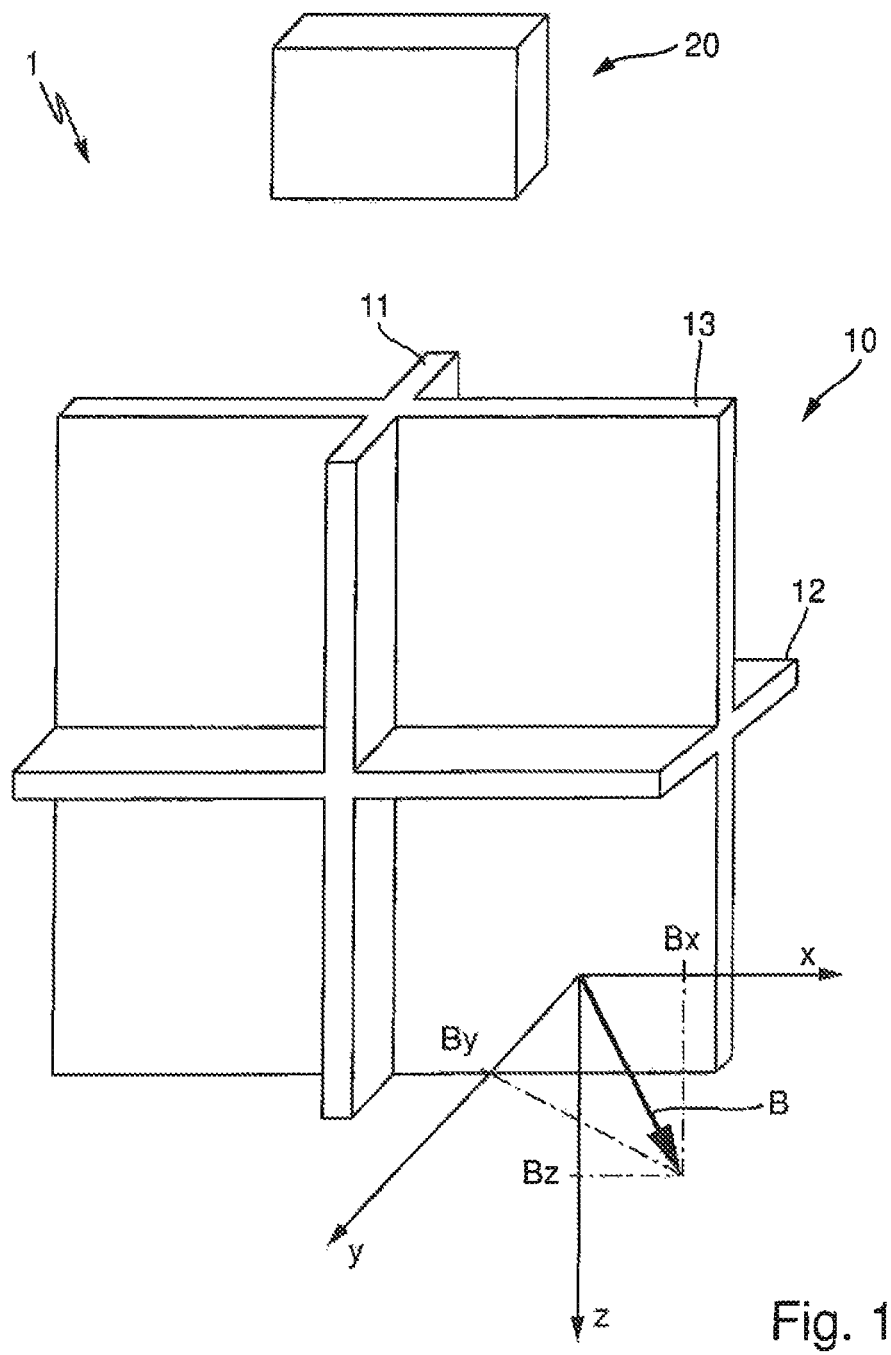
FIG. 1 shows a schematic illustration of a measuring system.

A measuring system 1 is illustrated schematically in FIG. 1. Measuring system 1 has a magnetic field sensor array 10 and an encoder 20. An evaluation circuit 30 is attached to magnetic field sensor array 10, as shown schematically in FIG. 2.

In addition, a coordinate system with the spatial directions x, y, and z is shown schematically in FIG. 1. The origin of the coordinate system is arranged at the center point of magnetic field sensor array 10; it is shown slightly offset in FIG. 1 for better visibility. Furthermore, a magnetic field vector B (here for the magnetic flux density) and its components $B_x$, $B_y$, $B_z$ in the spatial directions x, y, z are shown schematically. Magnetic field sensor array 10 has a first magnetic field sensor 11 and a second magnetic field sensor 12 and a third magnetic field sensor 13. Magnetic field sensors 11, 12, 13 are integrated into a semiconductor chip. Magnetic field sensors 11, 12, 13 in the exemplary embodiment of FIG. 1 are Hall sensors. Alternatively, magnetoresistive sensors or coils can be integrated as magnetic field sensors 11, 12, 13.

First magnetic field sensor 11 is designed to measure the first component $B_x$ of the magnetic field vector B in the first spatial direction x. Second magnetic field sensor 12 is designed to measure the second component $B_z$ of the magnetic field vector B in the second spatial direction z. Third magnetic field sensor 13 is designed to measure the third component $B_y$ of the magnetic field vector B in a third spatial direction y.

An especially flexible evaluation of magnetic field vector B and thereby the position of encoder 20 is possible by means of said magnetic field sensor array 10. FIG. 3 shows an illustration of the magnetic vector B in three-dimensional space (spherical coordinates). The magnetic vector B, for example, is projected onto the X-Y plane. During a change in the magnetic field, for example, by rotation, the magnetic field is also modulated in the z-direction. Magnetic field vector B describes a helical line. Encoder 20 therefore is configured to change the magnetic field vector B in the first spatial direction x and in the second spatial direction z and in the third spatial direction y, as a function of its rotary and/or translational movement. If the length of the projection of vector B onto the X-Y plane remains constant, this results in ambiguities at the cross points, because, for example, the forward path cannot be differentiated from return path at the cross points. Therefore, in the exemplary embodiment of FIG. 2, the absolute value of the x-component $B_x$ and the y-component $B_y$ of the magnetic field vector B is also modulated together with the z-modulation. In this respect, the advantage is achieved that ambiguities are avoided in that in the exemplary embodiment of FIG. 3 the change, caused by the movement of encoder 20, in magnetic field vector B describes a closed and non-intersecting line in all three spatial directions x, y, z.

As a departure from FIG. 3, encoders can be provided, in which magnetic field vector B for a complete cycle runs through a number of helices in different planes next to one another. As soon as vector B has arrived in a x-y plane outwardly or inwardly, it does not jump inward or outward in the same x-y plane but shifts to the adjacent x-y plane and runs helically inwardly or outwardly in the adjacent x-y plane in same rotation direction. Having reached the last x-y-plane, vector B runs helically back to the beginning, on a cylinder, without crossing the prior vector paths. In contrast, in FIG. 3 two helices which are pushed into one another can be seen, which also describe a closed and non-intersecting line in all three spatial directions x, y, z. As a departure from FIG. 3, also a greater number of helices pushed into one another can be used.

Figure 2:
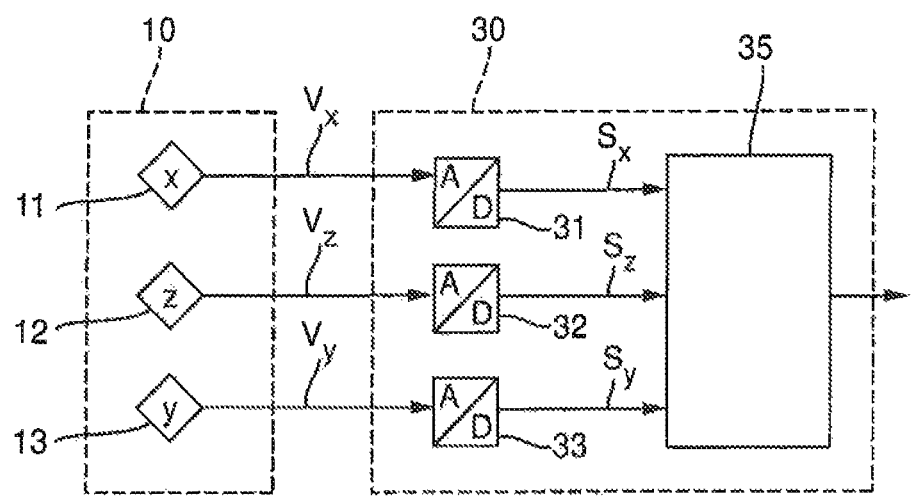
FIG. 2 shows a block circuit diagram.
Figure 3:
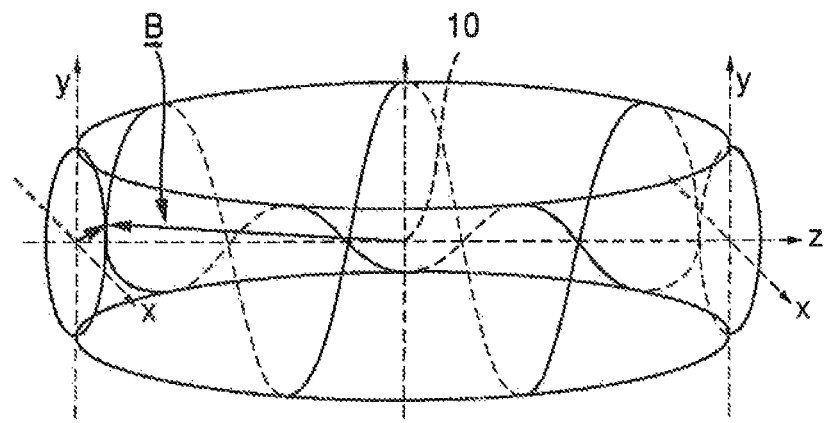
FIG. 3 is a schematic illustration of a line described by a magnetic vector in three-dimensional space.

A block circuit diagram with an evaluation circuit 30 is shown schematically in FIG. 2. First magnetic field sensor 11 and second magnetic field sensor 12 and third magnetic field sensor 13 of magnetic field sensor array 10 are connected to evaluation circuit 30. Each magnetic field sensor 11, 12, 13 outputs an analog measurement signal $V_x$, $V_y$, $V_z$, which is converted by one of the analog-to-digital converters 31, 32, 33 into a digital measurement signal $S_x$, $S_y$, $S_z$. Evaluation circuit 30 has a logic 35. Logic 35 is, for example, a processor. Evaluation circuit 30 is set up to determine the position of encoder 30 based on the first measurement signal $S_x$ of first magnetic field sensor 11 and the second measurement signal $S_z$ of second magnetic field sensor 12 and third measurement signal $S_y$ of third magnetic field sensor 13 by means of logic 35. The position from the measurement signals $S_x$, $S_y$, $S_z$ can be determined, for example, by means of an algorithm or by means of a table and interpolation.

Figure 4:
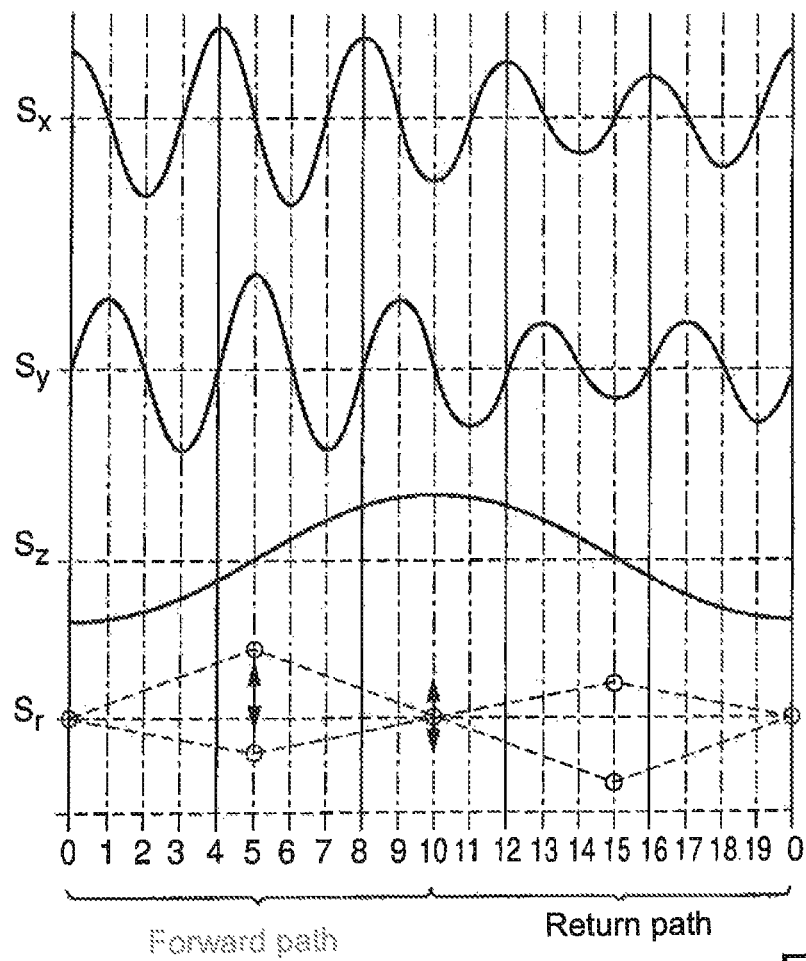
FIG. 4 shows a schematic diagram with measurement signals.

FIG. 4 shows the signals $S_x$, $S_y$, $S_z$, $S_r$ for the forward path and return path according to FIG. 3 in a schematic diagram. Here, the following applies:

$$S_r = \sqrt{S_x^2 + S_y^2 + S_z^2} \qquad (1)$$

The signal $S_r$ is the absolute value or the length of magnetic field vector B. There are many possible variations as long as the forward path and return path differ sufficiently greatly. The two reversal points need not, as shown in FIG. 4, lie on the same shell, etc.

The invention is not limited to the shown embodiment variants in FIGS. 1 to 4. For example, it is possible to generate a different line path of a closed non-intersecting line in three-dimensional space with encoder 20. The functionality of the measuring system according to FIG. 1 can be used especially advantageously for measuring positions and movements of adjustment systems.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A measuring system comprising:
   a magnetic field sensor array that has a first magnetic field sensor integrated into a semiconductor chip for measuring a first component of a magnetic field vector in a first spatial direction, a second magnetic field sensor integrated into a semiconductor chip for measuring a second component of the magnetic field vector in a second spatial direction, and a third magnetic field sensor integrated into a semiconductor chip for measuring a third component of the magnetic field vector in a third spatial direction, wherein the first spatial direction, the second spatial direction and the third spatial direction are orthogonal to one another;
   an encoder adapted to change the magnetic field vector in the first spatial direction and in the second spatial direction and in the third spatial direction as a function of a rotatory and/or translational movement, wherein the change of the magnetic field vector in all three spatial directions, caused by the movement of the encoder, traces a closed and non-intersecting path through space; and
   an evaluation circuit connected to which the first magnetic field sensor, the second magnetic field sensor and the third magnetic field sensor, the evaluation circuit determining a three-dimensional position of the encoder based on a first measurement signal of the first magnetic field sensor and a second measurement signal of the second magnetic field sensor and a third measurement signal of the third magnetic field sensor.

2. The measuring system according to claim 1, wherein at least one section of the path traced by the magnetic field vector is helical.

3. The measuring system according to claim 1, wherein the encoder is adapted to modulate a length of the magnetic field vector as a function of the rotatory and/or translational movement.

4. The measuring system according to claim 1, wherein the path traced by the magnetic field vector has at least two helical sections lying one inside the other.

5. The measuring system according to claim 1, wherein the encoder is adapted to modulate a pitch of a helical shape of the path of the magnetic field vector as a function of the rotatory and/or translational movement.

6. The measuring system according to claim 1, wherein the encoder modulate through the rotatory and/or translational movement, a first oscillation of the first component of the magnetic field vector with a first frequency and a second oscillation of the second component of the magnetic field vector with a second frequency, and wherein the first frequency and the second frequency are different.

7. The measuring system according to claim 1, wherein the encoder has a plurality of magnets or a plurality of coils to generate the magnetic field vector.

8. The measuring system according to claim 1, wherein the magnetic field sensor array has a plurality of magnets or a plurality of coils to detect the magnetic field vector.

9. The measuring system according to claim 1, wherein the path traced by the magnetic field vector is confined to a cylindrical segment centered on the magnetic field sensor array.

10. The measuring system according to claim 1, wherein the evaluation circuit calculates an intermediate variable for a path direction based on an absolute value of the first component of the magnetic field vector, an absolute value of the third component of the magnetic field vector, and the second component of the magnetic field vector.

11. The measuring system according to claim 1, wherein the first spatial component measurement, the second spatial component measurement, and the third spatial component measurement are continuously measured by the magnetic field sensor array.

12. The measuring system according to claim 1, wherein the first spatial component measurement, the second spatial component measurement, and the third spatial component measurement are simultaneously measured.

13. A measuring system comprising:
   a magnetic field sensor array that has a first magnetic field sensor integrated into a semiconductor chip for measuring a first component of a magnetic field vector in a first spatial direction, a second magnetic field sensor integrated into a semiconductor chip for measuring a second component of the magnetic field vector in a second spatial direction, and a third magnetic field sensor integrated into a semiconductor chip for measuring a third component of the magnetic field vector in a third spatial direction, wherein the first spatial direction, the second spatial direction and the third spatial direction are orthogonal to one another;
   an encoder adapted to change the magnetic field vector in the first spatial direction and in the second spatial direction and in the third spatial direction as a function of a rotatory and/or translational movement, wherein the change of the magnetic field vector in all three spatial directions, caused by the movement of the encoder, traces a closed and non-intersecting path through space; and
   an evaluation circuit connected to the first magnetic field sensor and the second magnetic field sensor and the third magnetic field sensor, the evaluation circuit determining a three-dimensional position of the encoder based on a first spatial component measurement from the first magnetic field sensor and a second spatial component measurement from the second magnetic field sensor and a third spatial component measurement from the third magnetic field sensor.

* * * * *